(12) United States Patent
Choi

(10) Patent No.: US 7,479,790 B2
(45) Date of Patent: Jan. 20, 2009

(54) CAPACITIVE PLATE DIELECTROMETER METHOD AND SYSTEM FOR MEASURING DIELECTRIC PROPERTIES

(75) Inventor: Christopher Y. Choi, Florissant, MO (US)

(73) Assignee: The Boeing Company, Chicago, IL (US)

( * ) Notice: Subject to any disclaimer, the term of this patent is extended or adjusted under 35 U.S.C. 154(b) by 217 days.

(21) Appl. No.: 11/595,066

(22) Filed: Nov. 9, 2006

(65) Prior Publication Data

US 2008/0111559 A1    May 15, 2008

(51) Int. Cl.
   *G01R 27/26*    (2006.01)
(52) U.S. Cl. ........................ 324/663; 324/457
(58) Field of Classification Search ................ 324/663, 324/547, 601
   See application file for complete search history.

(56) References Cited

U.S. PATENT DOCUMENTS

| | | | | |
|---|---|---|---|---|
| 4,814,690 A | * | 3/1989 | Melcher et al. | 324/674 |
| 6,147,503 A | * | 11/2000 | Nelson et al. | 324/637 |
| 6,252,398 B1 | * | 6/2001 | Goldfine et al. | 324/239 |
| 6,380,747 B1 | * | 4/2002 | Goldfine et al. | 324/457 |
| 6,496,018 B1 | * | 12/2002 | Nagata et al. | 324/636 |
| 6,856,140 B2 | * | 2/2005 | Talanov et al. | 324/638 |

* cited by examiner

*Primary Examiner*—Vincent Q Nguyen
(74) *Attorney, Agent, or Firm*—Dykema Gossett LLP

(57) ABSTRACT

A capacitive plate dielectrometer method and system is provided that is used to measure dielectric properties, such as permittivity, of a small sample test material at a low frequency. The capacitive plate dielectrometer method and system calibrates the capacitive plate dielectrometer with a plurality of standard dielectric materials and the sample test material is rotated in the capacitive plate dielectrometer to allow measurement of several electric field directions.

20 Claims, 4 Drawing Sheets

| DIRECTION OF WAVE | INCIDENT POLARIZATION | |
| --- | --- | --- |
| | V POL | H POL |
| L |  |  |
| W |  |  |
| T |  |  |
|  | Dimensional Nomenclature<br>T = Thickness, or real depth.<br>L = Ribbon direction or longitudinal direction.<br>W = Transverse direction or direction perpendicular to the ribbon. | LV = Ez Hy<br>LH = Ey Hz<br><br>WV = Ez Hx<br>WV = Ex Hz<br><br>TV = Ex Hy<br>TV = Ey Hx |

CAPACITIVE PLATE DIELECTROMETER METHOD AND SYSTEM FOR MEASURING DIELECTRIC PROPERTIES

GOVERNMENT LICENSE RIGHTS

This invention was made with Government support under contract number MDA972-99-9-0003 awarded by the U. S. Air Force. The Government has certain rights in this invention.

BACKGROUND OF THE INVENTION

1) Field of the Invention

A capacitive plate dielectrometer method and system is provided. More particularly, a capacitive plate dielectrometer method and system is provided that is used to measure dielectric properties, such as permittivity, of a test material or sample.

2) Description of Related Art

Methods are known for measuring dielectric properties for design and quality assurance used in the production of bulk absorbing materials, such as materials used in aircraft. Such methods for measuring the material properties use interrogating fields, such as electric, thermal, or acoustic fields. The type of field to be used depends upon the nominal properties of the test material and the condition of interest, such as the depth and location of any features or defects. With regard to dielectric properties, test materials may be classified according to their conductivity or permittivity. Electrical conductivity is a measure of a material's ability to conduct an electric current and is a measure of how well a material accommodates the transport of electric charge. Permittivity is a physical quantity that describes how an electric field affects and is affected by a dielectric medium, and it is determined by the ability of a material to polarize in response to the field and thereby reduce the field inside the material. Thus, permittivity relates to a material's ability to transmit or permit an electric field. Permittivity is directly related to electric susceptibility. For example, in a capacitor, an increased permittivity allows the same charge to be stored with a smaller electric field, and thus a smaller voltage, leading to an increased capacitance. In general, permittivity is not a constant, as it can vary with the position in the medium, the frequency of the field applied, humidity, temperature, and other parameters. In a nonlinear medium, the permittivity can depend on the strength of the electric field. Permittivity as a function of frequency can take on real or complex values. Dielectrics are associated with lossless or low-loss materials, and dielectrics are insulators with high permittivity. A given amount of material with high permittivity can store more charge than a material with lower permittivity. To make very high frequency permittivity measurements on test materials that have tensors (a set of quantities that obey certain transformation laws relating the bases in one generalized coordinate system to those of another and involving partial derivative sums, i.e., vectors), such as honeycomb cores, the measurements are typically conducted using rectangular waveguides because of the way the electric fields are oriented. Rectangular waveguide measurements involving frequencies greater than several gigahertz require only a relatively small test sample. However, for lower frequency permittivity testing, waveguide dimensions must become progressively larger. Large waveguide test setup is cumbersome and tedious. Typical large waveguide dimensions may be 48 inches long by 12 inches high by three inches thick in one direction. Moreover, with large waveguides, larger quantities of test materials are required to properly test the material, which can result in possible test sample fabrication difficulties. Low frequency permittivity testing requires large amounts of test material. For example, to test the frequency range from 142 MHz (megahertz) to 242 MHz (megahertz) in a rectangular waveguide, one needs a sample to typically have the dimensions of 48 inches long by 12 inches high by three inches thick in one direction. Use of large quantities of low frequency test materials is expensive and the length of testing is time consuming.

Accordingly, there is a need for an improved capacitive plate dielectrometer method and system for measuring dielectric properties, such as permittivity, of a test material or sample that does not have the problems associated with known devices and methods.

SUMMARY OF THE INVENTION

The need for an improved capacitive plate dielectrometer method and system for measuring dielectric properties, such as permittivity, of a test material or sample, is satisfied. None of the known capacitive plate dielectrometer methods and systems provides all of the numerous advantages discussed herein. Unlike known methods and systems, the improved capacitive plate dielectrometer method and system provide the following advantages: the method and system use only a small amount of test material and are still able to extract the test material's constitutive parameters at the desired frequencies; the method and system use a small amount of test material, such as a three inch honeycomb cube, that allows measurements of all polarizations and electric field directions and allows anisotropic measurements to be taken with only one test sample; the method and system may be used as a quality assurance tool to reduce material waste and labor time involved compared to known methods; the method and system result in lower test equipment costs and provides easier specimen fabrication that requires less machining and fabrication time (i.e., it is easier to make a three inch honeycomb cube test sample than a large rectangular wave guide); the method and system use a calibration and measuring process for one orientation that takes less time to measure than known methods; the method and system achieve the same measurements, values, productivity, and permittivity as known methods, but use a smaller sample that can be rotated within the capacitive plate dielectrometer to measure various electric field vector directions; and, the method and system measure the permittivity of a sample test material and allow a user to change the dielectric material and test material inside the capacitive plate dielectrometer.

One embodiment of the invention provides for a method for measuring dielectric properties of a test material using a capacitive plate dielectrometer device, comprising the steps of: obtaining a small sample of the test material having a size and shape that allows the sample test material to fit within the capacitive plate dielectrometer; attaching a connecting cable to a measuring device and calibrating the connecting cable; connecting the calibrated connecting cable to the capacitive plate dielectrometer; calibrating the capacitive plate dielectrometer with a plurality of standard dielectric materials, wherein each standard dielectric material is inserted into the capacitive plate dielectrometer, and dielectric property data is collected by the measuring device for each standard dielectric material; and, inserting the sample test material into the capacitive plate dielectrometer and collecting dielectric property data using the measuring device. The method may further comprise the step, prior to calibrating the capacitive plate dielectrometer with a plurality of standard dielectric materials, of leveling the capacitive plate dielectrometer with a leveling device such as a clinometer. Preferably, the dielectric properties of the standard dielectric material and the sample test material are measured at a frequency in the range of from about 50 megahertz to about 600 megahertz. Preferably, the measuring device is a combination of a network analyzer and a computer having data acquisition software. Preferably, the dielectric property measured is the permittivity of the sample test material. Preferably, the sample test material is a three inch honeycomb cube, and the standard dielectric materials may comprise polystyrene foam, polystyrene plastic, alumina, and/or polytetrafluoroethylene.

Another embodiment of the invention provides for a system for measuring dielectric properties of a test material, the system comprising: a capacitive plate dielectrometer device; a measuring device with data acquisition software, such that the measuring device has a capability to measure frequency in the range of from about 50 megahertz to about 600 megahertz; a calibrated connecting cable for connecting the measuring device to the capacitive plate dielectrometer; a plurality of standard dielectric materials, wherein each standard dielectric material is inserted into the capacitive plate dielectrometer and dielectric property data is collected by the measuring device for each standard dielectric material; and, a small sample of the test material having a size and shape that allows the sample to be inserted into and fit within the capacitive plate dielectrometer, such that dielectric property data of the sample is collected by the measuring device. The system may further include a leveling device for leveling the capacitive plate dielectrometer. Preferably, the measuring device is a combination of a network analyzer and a computer having data acquisition software. Preferably, the sample test material is a three inch honeycomb cube. Preferably, the standard dielectric materials may comprise polystyrene foam, polystyrene plastic, alumina, and/or polytetrafluoroethylene.

BRIEF DESCRIPTION OF THE DRAWINGS

The foregoing and other advantages and features of embodiments of the invention, and the manner in which the same are accomplished, will become more readily apparent upon consideration of the following detailed description of embodiments of the invention taken in conjunction with the accompanying drawings which illustrate preferred and exemplary embodiments, but which are not necessarily drawn to scale, wherein.

DETAILED DESCRIPTION OF THE INVENTION

Several embodiments of the invention will now be described more fully hereinafter with reference to the accompanying drawings, in which some, but not all embodiments of the invention are shown. Indeed, the embodiments of the invention may be embodied in several different forms and should not be construed as limited to the embodiments set forth herein. Rather, these embodiments are provided so that this disclosure will be thorough and complete and will fully convey the scope of the invention to those skilled in the art. Like numbers refer to like elements throughout.

Figure 1:
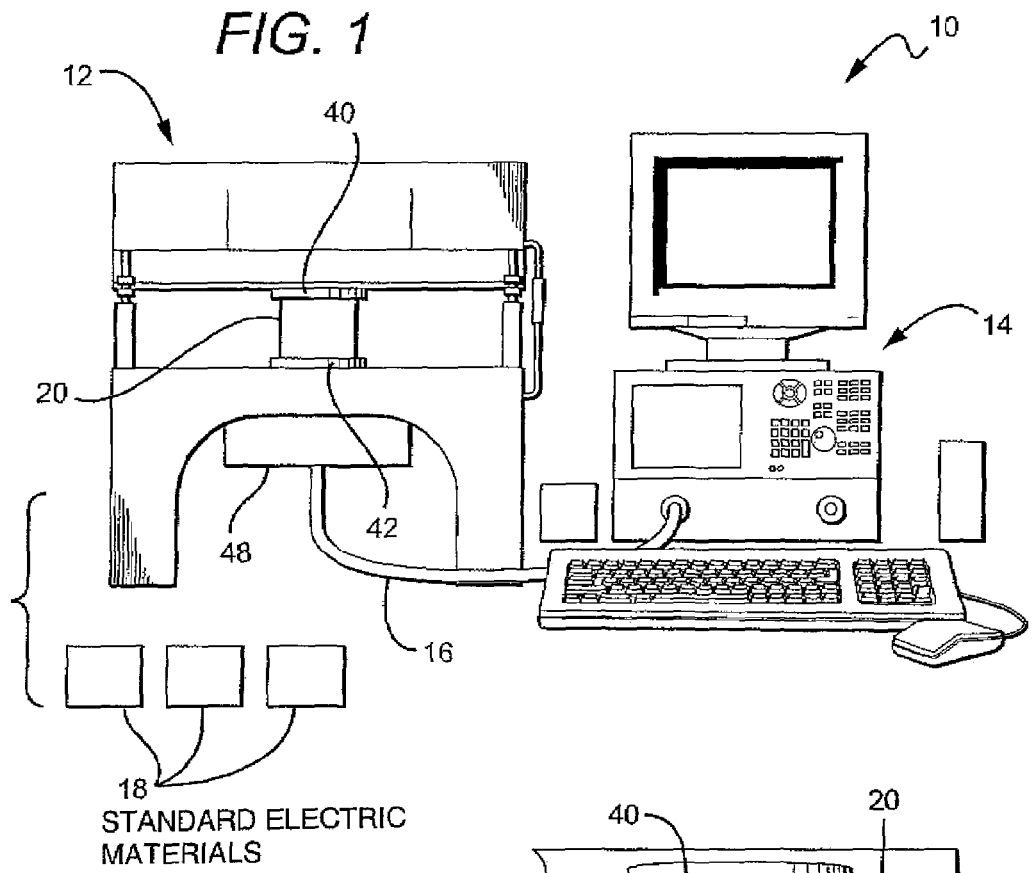
FIG. 1 is a front view illustrating the system of one embodiment of the invention.
Figure 2:
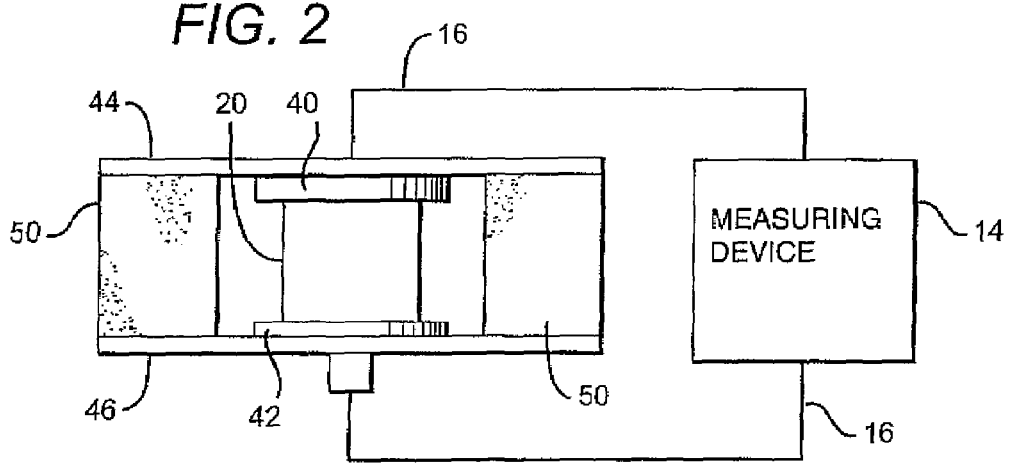
FIG. 2 is a front close-up view illustrating the capacitive plate dielectric device of one embodiment of the invention connected to the measuring device.
Figure 3:
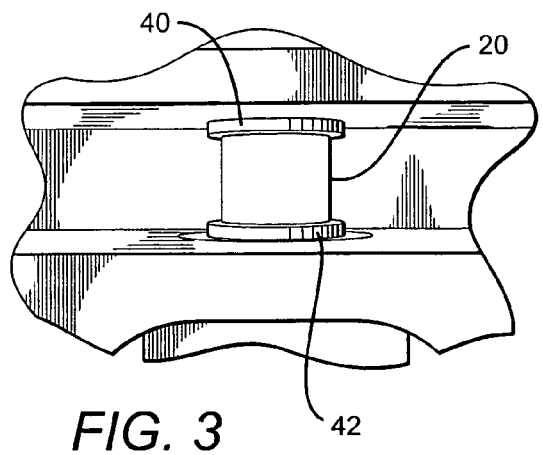
FIG. 3 is a front close-up view illustrating the test sample in the capacitive plate dielectrometer of one embodiment of the invention.
Figure 4:
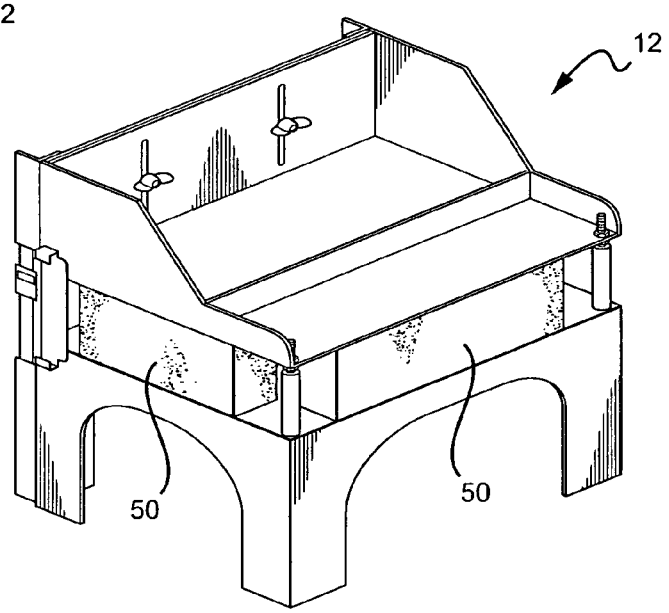
FIG. 4 is a left side perspective view of the capacitive plate dielectrometer in a closed configuration.
Figure 5:
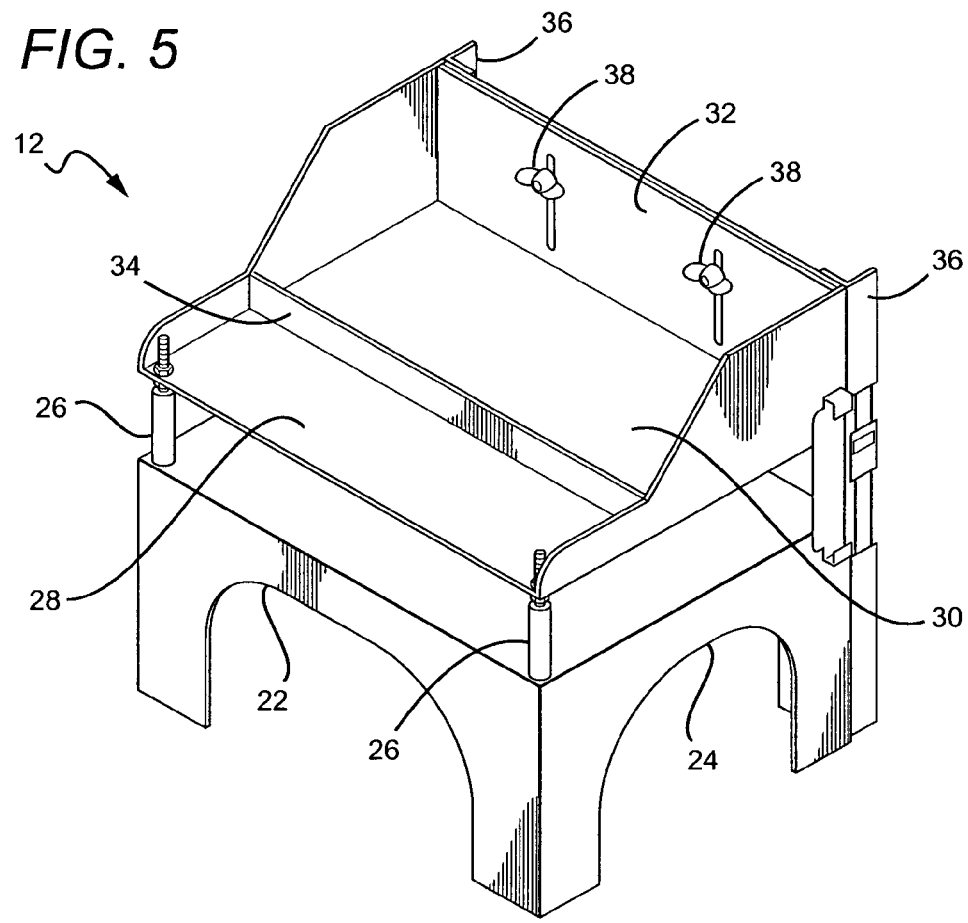
FIG. 5 is a right side perspective view of the capacitive plate dielectrometer of one embodiment of the invention.

A capacitive plate dielectrometer method and system is provided that is used to measure dielectric properties, such as permittivity, of a test material or sample. One embodiment of the invention provides for a system for measuring dielectric properties of a test material. Referring now to the drawings, and in particular, to FIG. 1, there is shown a front view illustrating system 10 of one embodiment of the invention. The system 10 comprises a capacitive plate dielectrometer device 12, a measuring device 14, a calibrated connecting cable 16 for connecting the measuring device 14 to the capacitive plate dielectrometer 16, a plurality of standard dielectric materials 18, and a small sample of test material 20 having a size and shape that allows the sample to be inserted into and fit within the capacitive plate dielectrometer. FIG. 2 is a front close-up view illustrating the capacitive plate dielectric device of one embodiment of the invention connected to the measuring device 14. FIG. 5 is a right side perspective view of the capacitive plate dielectrometer 12 of one embodiment of the invention. As shown in FIG. 5, the capacitive plate dielectrometer 12 may comprise a front brace 22, a side brace 24, spacers 26, a lower guard plate 28, an upper guard plate 30, a back plate 32, an upper plate stiffener 34, back plate stiffeners 36, and wing nuts 38. The capacitive plate dielectrometer 12 further comprises an upper electrode 40 and a lower electrode 42 (see FIGS. 1-3 and 6-9). Preferably, the upper electrode 40 is coupled to upper fixture plate 44 and lower electrode 42 is coupled to lower fixture plate 46 (see FIG. 2). The capacitive plate dielectrometer may further comprise cavity 48 (see FIG. 1). The purpose of the cavity is to transition from the connecting cable to the capacitive plate dielectrometer. The capacitive plate dielectrometer may further comprise loaded foam inserts 50 (see FIGS. 2, 4) to dampen fringing fields and to prevent outside interference. FIG. 4 is a left side perspective view of the capacitive plate dielectrometer in a closed configuration with the foam inserts 50. The capacitive plate dielectrometer is a capacitor which is an electrical device that can store energy in the electric field between the pair of closely spaced electrodes. When voltage is applied to the capacitive plate dielectrometer, electric charges of equal magnitude but opposite polarity build up on each electrode. The capacitive plate dielectrometer allows a user to change the dielectric or sample material inside the capacitor.

The capacitive plate dielectrometer is designed to make low frequency complex permittivity measurements on a sample test material. Preferably, a small sample of a larger amount of test material is obtained, such that the small sample has a size and shape that allows the sample test material to fit within the capacitive plate dielectrometer. Preferably, the sample test material should fit snugly within the capacitive plate dielectrometer with minimal compression. FIG. 3 is a front close-up view illustrating a test sample in the capacitive plate dielectrometer of the invention. Preferably, the test sample is smaller in diameter than the diameter of the electrodes 40, 42. Preferably, the sample test material is less than about five inches in height and less than about five inches in width. More preferably, the sample test material is a three inch by three inch by three inch +/−0.015 inch honeycomb cube configuration made of paper and may be obtained from Hexcel Corporation of Stamford, Conn., or from Cuming Microwave Corporation of Avon, Mass. However, four or five inch honeycomb cubes may also be used. Although the preferred sample test material may be made of honeycomb core, the sample test material may also be made of plastic, thermoplastic, wood, concrete, foam, ceramic, or another suitable material. The honeycomb core is lossy and has carbon loading. Lossy material is material that acts like a resistor. It slows down the current. It is either core reloaded or something that has loss in it. The system requires very little test sample material or volume of the parent honeycomb block. A three inch cube test sample allows measurements of all polarizations and allows anisotropic measurements with one test sample. Due to the preferred cubic shape of the test sample, it can obtain all of the desired polarizations. The top and bottom faces of the honeycomb cube are preferably parallel within 0.0004 inch and perpendicular to the axis of the coaxial line of the capacitive plate dielectrometer within +/−0.5 degrees. The anisotropic nature of the honeycomb core test material requires electrical fields that are not radial. The test sample is preferably machined and is preferably only a dielectric. Test samples may be cut to form, and an external machine shop may be used when high precision is desired. Due to the nature of the capacitive plate dielectrometer and the cubic shape of the test sample, the tensors needed to characterize the test material can be obtained. The system requires much less material than known measurement systems to obtain the tensors of permittivity in a material. This also results in reduced labor and time needed to test the material.

The measuring device 14 used with the system preferably comprises a combined device comprising a vector network analyzer and a computer having data acquisition software. However, the measuring device may also comprise a separate vector network analyzer and a separate computer having data acquisition software. Preferably, the network analyzer has the capability to measure frequency in the range of from about 50 megahertz to about 600 megahertz. More preferably, the network analyzer of the measuring device has a capability to measure frequency in the range of from about 100 megahertz to about 500 megahertz. Preferably, the network analyzer may be one such as obtained from Agilent Technologies of Santa Clara, Calif. The network analyzer measures and collects dielectric property data from both the standard dielectric materials and from the test sample material. Preferably, the dielectric property measured is the permittivity of the standard dielectric materials and sample test material. Preferably, the data acquisition software program used is a dielectric spreadsheet type software program, such as one developed that uses Visual Basic for Applications in Excel. The data acquisition software program from the computer collects the data from the network analyzer and calculates the dielectric properties.

The calibrated connecting cable 16 used with the system is preferably a radio frequency (RF) coaxial cable that may be used with appropriate coaxial cable adaptors. The connecting cable may be calibrated with a calibration kit (not shown) that uses open, short, and load standards to calibrate the cable. Open refers to connecting to the open coaxial standard. Short refers to the short coaxial standard. Load refers to the 50 ohm (ohm is a resistance that produces a potential difference of one volt when a current of one ampere is flowing through it) termination standard. Preferably, the calibration kit may be one such as obtained from Agilent Technologies of Santa Clara, Calif. After the connecting cable is calibrated, the cable may be connected to the capacitive plate dielectrometer and adapters may be used, if necessary.

The standard dielectric materials used with the system are used to calibrate the capacitive plate dielectrometer. Preferably, the standard dielectric materials comprise polystyrene foam, polystyrene plastic, alumina, and/or polytetrafluoroethylene. However, other suitable standard dielectric materials may be used. A plurality of standard dielectric material may be used to calibrate the capacitive plate dielectrometer. Preferably, three or four standard dielectric materials may be used to calibrate the capacitive plate dielectrometer. More preferably, three standard dielectric materials may be used to calibrate the capacitive plate dielectrometer. Each standard dielectric material is inserted into the capacitive plate dielectrometer and dielectric property data, such as S-parameter (scattering parameter) data or permittivity, may be collected by the network analyzer for each standard dielectric material. Preferably, each standard dielectric material is of the size three inches by three inches by three inches +/−0.015 inch in a cube configuration, and preferably the dielectric materials have excellent dielectric properties. Preferably, the polystyrene foam is extruded polystyrene thermal insulation material (the trade name being Styrofoam). Preferably, the polystyrene plastic (the trade name being Rexolite) is a thermoset, rigid and translucent plastic produced by cross linking polystyrene with divinylbenzene and has a dielectric constant of 2.53 (up to 500 GHz (gigahertz)) together with an extremely low dissipation factor and high voltage resistance. Preferably, the alumina is 99.8% pure, a ceramic, and has excellent thermal and electrical insulator properties. Preferably, the polytetrafluoroethylene (PTFE) (the trade name being Teflon) is electrical grade, is a very low loss material, and has low friction and non-reactivity properties. The calibration system that uses one or more well-known and standard dielectric materials is referred to herein as "Load Law" calibration. The standard dielectric materials are used to calibrate the capacitive plate dielectrometer so that the test sample may be measured more accurately.

Figure 6:
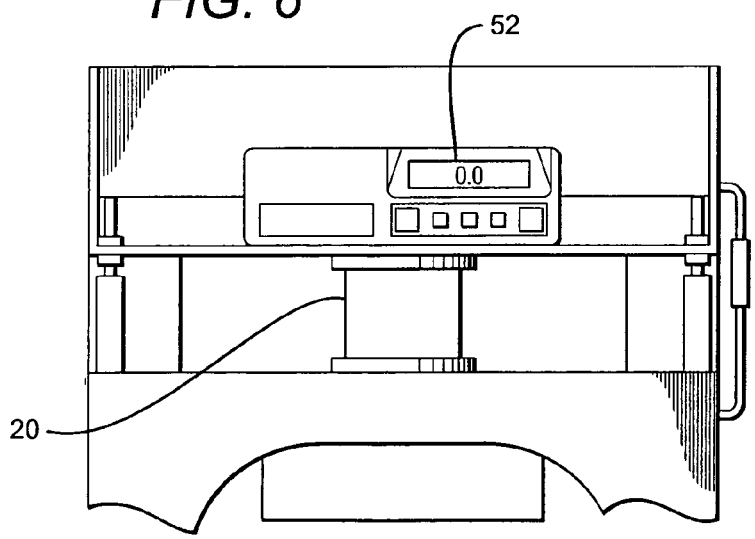
FIG. 6 is a front close-up view illustrating the capacitive plate dielectrometer with a leveling device in the form of a clinometer.

The system may further include a leveling device 52 for leveling the capacitive plate dielectrometer (see FIG. 6). Preferably, the leveling device 52 is a clinometer. FIG. 6 is a front close-up view illustrating the capacitive plate dielectrometer of another embodiment of the invention with a leveling device in the form of a clinometer. A clinometer is an instrument for measuring angles of slope or tilt, elevation or inclination of an object with respect to gravity. Certain highly sensitive electronic clinometer sensors can achieve an output accurate to 0.001 degrees.

Another embodiment of the invention provides for a method for measuring dielectric properties of a test material using a capacitive plate dielectrometer device. The method comprises the step of obtaining a small sample of the test material having a size and shape that allows the sample test material to fit within the capacitive plate dielectrometer. Preferably, the size of the sample test material is less than about five inches in height and less than about five inches in width. More preferably, the sample test material is a three inch honeycomb cube. The method further comprises the step of attaching a connecting cable to a measuring device and calibrating the connecting cable. Preferably, the connecting cable is a coaxial cable that is calibrated using a calibration kit that uses open, short, and load standards. Preferably, the measuring device is a combined device comprising a network analyzer and a computer having data acquisition software. The method further comprises the step of connecting the calibrated connecting cable to the capacitive plate dielectrometer. The method further comprises the step of calibrating the capacitive plate dielectrometer with a plurality of standard dielectric materials, and preferably calibrating the capacitive plate dielectrometer with three standard dielectric materials, wherein each standard dielectric material is inserted into the capacitive plate dielectrometer and dielectric data, such as S-parameter data or permittivity, is collected by the measuring device for each standard dielectric material. Preferably, the standard dielectric material may comprise polystyrene foam (such as Styrofoam), polystyrene plastic (such as Rexolite), alumina, and/or polytetrafluoroethylene (such as Teflon). The method further comprises the step of inserting the sample test material into the capacitive plate dielectrometer and collecting dielectric property data, such as S-parameter data or permittivity, using the measuring device. The test sample is preferably rotated to get other permittivity tensors of the test material. Preferably, the dielectric properties of the standard dielectric material and the sample test material are measured at a frequency in the range of from about 50 megahertz to about 600 megahertz. Preferably, the dielectric property measured is the permittivity of the test material.

Figure 9:
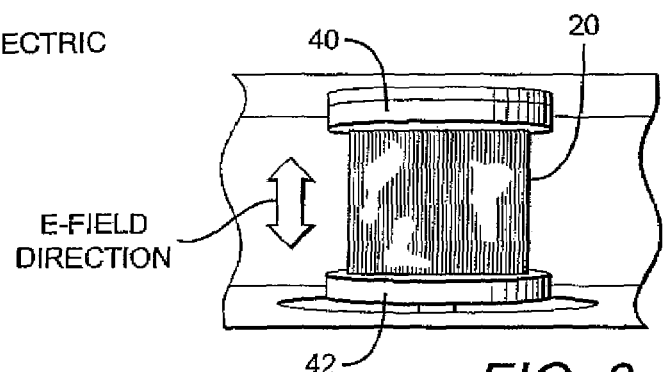
FIG. 9 is a front view of a sample test material in the capacitive plate dielectrometer where the electric field orientation of the sample test material is LV and WV property measurement; and, FIG. 10 is an illustration showing the wave directions and incident polarizations for the orientations shown in FIGS. 7-9.
Figure 7:
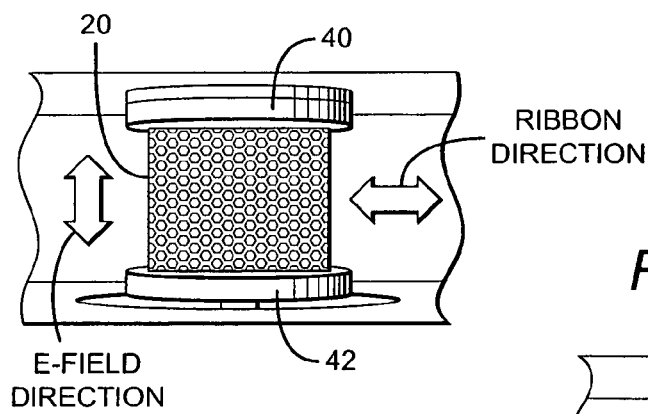
FIG. 7 is a front view of a sample test material in the capacitive plate dielectrometer where the electric field orientation of the sample test material is LH and TH property measurement.
Figure 8:
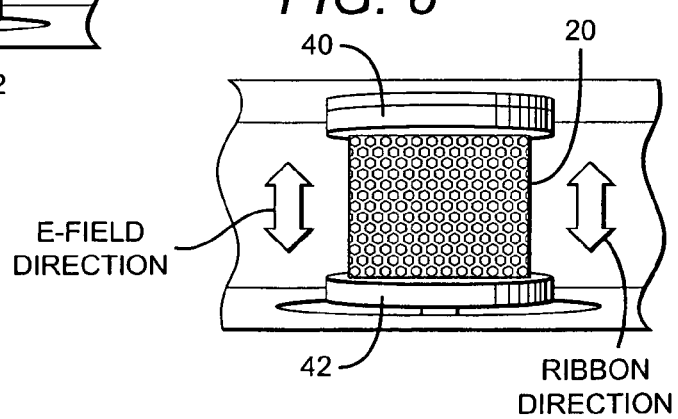
FIG. 8 is a front view of a sample test material in the capacitive plate dielectrometer where the electric field orientation of the sample test material is WH and TV property measurement.
Figure 10:
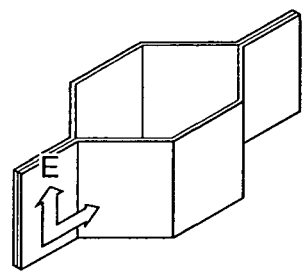
Figure 10:
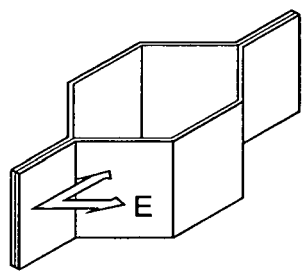
Figure 10:
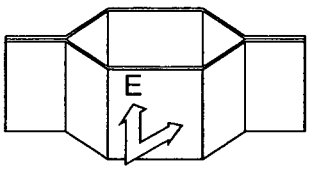
Figure 10:
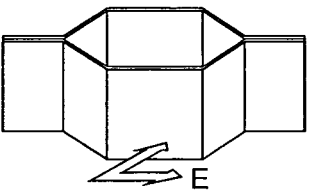
Figure 10:
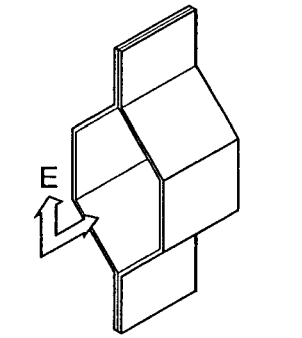
Figure 10:
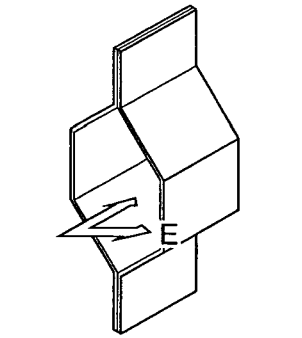
Figure 10:
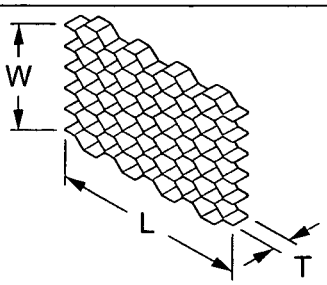

The sample test material may be rotated in the capacitive plate dielectrometer to allow measurements of preferably three electric field directions. When the test sample material is inserted into the capacitive plate dielectrometer, the first electric field or orientation is preferably LH and TH. The "H" in LH and TH is horizontal incident polarization of the e-field (electric field), the "L" in LH is longitudinal direction or ribbon direction of the wave propagation, and the "T" in TH is the thickness or cel depth direction of the wave propagation. FIG. 7 is a front view of a sample test material in the capacitive plate dielectrometer where the orientation of the sample test material is LH and TH property measurement. Once this electric field or orientation is measured, the sample test material may be rotated 90 degrees in one plane to measure a second electric field or orientation that is preferably WH and TV. The "W" in WH is a transverse direction or direction perpendicular to the ribbon of a direction of the wave propagation, the "H" in WH is horizontal incident polarization of the e-field (electric field), the "T" in TV is the thickness or cel depth direction of the wave propagation, and the "V" in TV is vertical incident polarization of the e-field (electric field). FIG. 8 is a front view of a sample test material in the capacitive plate dielectrometer where the orientation of the sample test material is WH and TV property measurement. Once this electric field or orientation is measured, the sample test material may be rotated 90 degrees in another plane to measure a third electric field or orientation that is preferably LV and WE. The "L" in LV is longitudinal direction or ribbon direction of the wave propagation, the "V" in LV is vertical incident polarization of the e-field (electric field), the "W" in WV is a transverse direction or direction perpendicular to the ribbon of a direction of the wave propagation, and the "V" in WV is vertical incident polarization of the e-field (electric field). FIG. 9 is a front view of a sample test material in the capacitive plate dielectrometer where the orientation of the sample test material is LV and WV property measurement. The electric fields (e-fields) are always the same on the plane. The sample test material is rotated to get all three directions, and then the next sample test material is measured. FIG. 10 is an illustration showing the wave directions and incident polarizations for the orientations of the sample test material shown in FIGS. 7-9.

The method may further comprise the step, prior to calibrating the capacitive plate dielectrometer with at least one standard dielectric material, of leveling the capacitive plate dielectrometer with a leveling device, such as a clinometer.

An experiment using the system and method discussed herein was conducted. A three inch by three inch by three inch honeycomb cube sample test material was cut and prepared from a large test material. The equipment used included: a capacitive plate dielectrometer with loaded foam inserts as shown in the FIGS., a network analyzer with at least a 50 MHz to 600 MHz capability, an RF (radio frequency) coaxial connecting cable and associated adaptors, a calibration kit for calibrating the cable, dielectric EM Excel 3.06 software, an electrostatic discharge wrist strap, a clinometer, an external personal computer with Excel 2002 software or above and GPIB (General Purpose Interface Bus) card with appropriate drivers, and standard dielectric materials including three inch by three inch by three inch cubes of Styrofoam, Rexolite, Teflon, and alumina. The network analyzer was turned on and allowed to warm up for approximately 30 minutes. Electrostatic discharge protocols were observed. The network analyzer was set up to the following: start frequency of 50 MHz (megahertz), stop frequency of 600 MHz (megahertz), number of points (201 points), stepped sweep, averaging 16, waveguide cutoff—coaxial, Z0 (impedance of free space) to 50 Omega, IF (intermediate frequency) bandwidth of 10 KHz (kilohertz) or lower. The RF cable was connected to port 1 of the network analyzer. The cable was calibrated using the calibration kit open, short, and load standards to calibrate the cable. Once the cable was calibrated, it was connected to the capacitive plate dielectrometer with adaptors. With the Load Law calibration, the top wing nuts of the capacitive plate dielectrometer were unscrewed, the top portion of the capacitive plate was lifted to the highest level and the wing nuts were retightened. The Styrofoam standard dielectric material was centered on the lower electrode of the capacitive plate dielectrometer. Using one hand to support the upper electrode section, the wing nuts were unscrewed and the top section was gently lowered until the upper electrode rested on the Styrofoam standard. The loaded foam inserts were then inserted in the appropriate places. The clinometer was used to show a parallel surface to the lower fixture plate. With the network analyzer, the measurement was restarted and the S-parameter data and permittivity data was collected using dielectric EM Excel capacitive plate test. The same procedure with the Load Law calibration was repeated with Rexolite and data was collected. The same procedure with Load Law calibration was repeated with alumina and data was collected. To validate the Load Law calibration, the Teflon standard was measured. The same procedure with Load Law calibration was repeated with Teflon and data was collected. When the values fell between 2.0-2.1 on the real part of permittivity and virtually zero on the imaginary part, then the Load Law calibration was successful. If calculated data was deemed acceptable, measurements on a sample test material may be conducted. With the sample testing, the honeycomb cube sample was confirmed to be within tolerances and have parallel sides. The sample test material was measured with the same Load Law calibration procedure as used with the standard dielectric materials. The sample test material was inserted into the capacitive plate dielectrometer and the upper electrode was lowered onto the test sample, such that the upper electrode contacted the entire top surface of the sample test material. The sample test material was rotated within the capacitive plate dielectrometer to measure the orientations as shown in FIGS. 7-9 for various core directions. S-parameter and permittivity measurements of the sample test material were measured. Any irregularities, such as sample compression, were noted. The data from the sample test material measurements was collected, processed and recorded by the measuring device network analyzer and computer.

The method and system discussed herein is advantageous because it measures multiple orientations of test samples, has less material waste, provides easier test sample fabrication, reduces the time and labor involved, and provides lower test equipment cost than known methods and systems. The system and method provide a calibration and measuring process that only takes about forty (40) seconds for one measurement of one orientation. The total time for measuring all three orientations or electric fields of one test sample is about two to three minutes. With a wave guide, it takes much longer because the test sample must be placed in the sample holder and it is very heavy. The method and system is preferably used in the production of bulk absorbing materials, and in particular, bulk absorbing materials used in aircraft and airplanes. The method and system discussed herein may also have applications for bulk absorbing materials used in anechoic chambers. Anechoic chambers are used in the aerospace industry for radar cross section measurement, among other areas. The method and system may also be used in electrical properties measurement laboratories and environments and may be used as a quality assurance tool.

Many modifications and other embodiments of the invention will come to mind to one skilled in the art to which one embodiment of the invention pertains having the benefit of the teachings presented in the foregoing descriptions and the associated drawings. Therefore, it is to be understood that one embodiment of the invention is not to be limited to the specific embodiments disclosed that modifications and other embodiments are intended to be included within the scope of the appended claims. Although specific terms are employed herein, they are used in a generic and descriptive sense only and not for purposes of limitation.

What is claimed is:

1. A method for measuring dielectric properties of a test material using a capacitive plate dielectrometer device, comprising the steps of:
    obtaining a small sample of the test material having a size and shape that allows the sample test material to fit within the capacitive plate dielectrometer;
    attaching a connecting cable to a measuring device and calibrating the connecting cable;
    connecting the calibrated connecting cable to the capacitive plate dielectrometer;
    calibrating the capacitive plate dielectrometer with a plurality of standard dielectric materials, wherein each standard dielectric material is inserted into the capacitive plate dielectrometer, and dielectric property data is collected by the measuring device for each standard dielectric material; and,
    inserting the sample test material into the capacitive plate dielectrometer and collecting dielectric property data using the measuring device.

2. The method of claim 1 wherein the dielectric properties of the standard dielectric materials and the sample test material are measured at a frequency in the range of from about 50 megahertz to about 600 megahertz.

3. The method of claim 1 wherein a dielectric property measured is the permittivity of the standard dielectric materials and the permittivity of the sample test material.

4. The method of claim 1 wherein the size of the sample test material is less than about five inches in height and less than about five inches in width.

5. The method of claim 1 wherein the sample test material is a three inch honeycomb cube.

6. The method of claim 1 wherein the connecting cable is a coaxial cable that is calibrated using open, short, and load standards.

7. The method of claim 1 wherein the measuring device is a combination of a network analyzer and a computer having data acquisition software.

8. The method of claim 1 wherein the standard dielectric materials are selected from the group comprising polystyrene foam, polystyrene plastic, alumina, and polytetrafluoroethylene.

9. The method of claim 1 wherein the capacitive plate dielectrometer is calibrated with three standard dielectric materials.

10. The method of claim 1 further comprising the step, prior to calibrating the capacitive plate dielectrometer with a plurality of standard dielectric materials, of leveling the capacitive plate dielectrometer with a leveling device.

11. A method of measuring the permittivity of a test material in a frequency range of from about 50 megahertz to about 600 megahertz, using a capacitive plate dielectrometer device, comprising the steps of:
    obtaining a sample of the test material having a size less than about five inches in height and less than about five inches in width;
    attaching a coaxial cable to a measuring device having data acquisition software and calibrating the connecting cable;
    connecting the calibrated connecting cable to the capacitive plate dielectrometer;
    calibrating the capacitive plate dielectrometer with a plurality of standard dielectric materials, wherein each standard dielectric material is inserted into the capacitive plate dielectrometer and permittivity data is collected by the measuring device for each standard dielectric material; and,
    inserting the sample test material into the capacitive plate dielectrometer and collecting permittivity data using the measuring device, and wherein the sample test material is rotated in the capacitive plate dielectrometer to allow measurements of three electric field directions.

12. The method of claim 11 wherein the sample test material is a three inch honeycomb cube.

13. The method of claim 11 wherein the measuring device is a combination of a network analyzer and a computer having data acquisition software.

14. The method of claim 11 wherein the standard dielectric materials are selected from the group comprising polystyrene foam, polystyrene plastic, alumina, and polytetrafluoroethylene.

15. The method of claim 11 further comprising the step, prior to calibrating the capacitive plate dielectrometer with a plurality of standard dielectric materials, of leveling the capacitive plate dielectrometer with a leveling device.

16. A system for measuring dielectric properties of a test material, the system comprising:

a capacitive plate dielectrometer device;

a measuring device with data acquisition software, such that the measuring device has a capability to measure frequency in the range of from about 50 megahertz to about 600 megahertz;

a calibrated connecting cable for connecting the measuring device to the capacitive plate dielectrometer;

a plurality of standard dielectric materials, wherein each standard dielectric material is inserted into the capacitive plate dielectrometer and dielectric property data is collected by the measuring device for each standard dielectric material; and, a small sample of the test material having a size and shape that allows the sample to be inserted into and fit within the capacitive plate dielectrometer, such that dielectric property data of the sample is collected by the measuring device.

17. The system of claim 16 further including a leveling device for leveling the capacitive plate dielectrometer.

18. The method of claim 16 wherein the measuring device is a combination of a network analyzer and a computer having data acquisition software.

19. The system of claim 16 wherein the sample test material is a three inch honeycomb cube.

20. The system of claim 16 wherein the standard dielectric materials are selected from the group comprising polystyrene foam, polystyrene plastic, alumina, and polytetrafluoroethylene.

* * * * *